US006603353B2

(12) United States Patent
Ishida

(10) Patent No.: US 6,603,353 B2
(45) Date of Patent: Aug. 5, 2003

(54) SWITCHING POWER AMPLIFIER

(75) Inventor: Masaomi Ishida, Chiba (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/007,709

(22) Filed: Nov. 8, 2001

(65) Prior Publication Data

US 2002/0075072 A1 Jun. 20, 2002

(30) Foreign Application Priority Data

Nov. 16, 2000 (JP) .................................. P2000-349793

(51) Int. Cl.[7] ............................................. H03F 3/217
(52) U.S. Cl. ................................. 330/251; 330/207 A
(58) Field of Search ............................. 330/207 A, 251

(56) References Cited

U.S. PATENT DOCUMENTS 4,081,731 A * 3/1978 Wesner ...................... 318/599
5,805,020 A * 9/1998 Danz et al. ................... 330/10
5,973,368 A * 10/1999 Pearce et al. ............... 257/368
5,982,231 A * 11/1999 Nalbant ........................ 330/10

* cited by examiner

Primary Examiner—Patricia Nguyen
(74) Attorney, Agent, or Firm—Jay H. Maioli

(57) ABSTRACT

A switching power amplifier including a series circuit of first and second switching elements and a series circuit of third and fourth switching elements, wherein a load is connected between a junction between the first and second switching elements and a junction between the third and fourth switching elements and in which the first, second, third, and fourth switching elements are turned on and off to drive the load; the switching power amplifier includes a current detecting device for detecting respective currents of the first, second, third, and fourth switching elements; and the first, second, third, and fourth switching elements are turned off when the current detecting device detects an abnormal current. The switching power amplifier is able to protect an audio device such as a speaker from an excess current without using a connection switch.

6 Claims, 3 Drawing Sheets

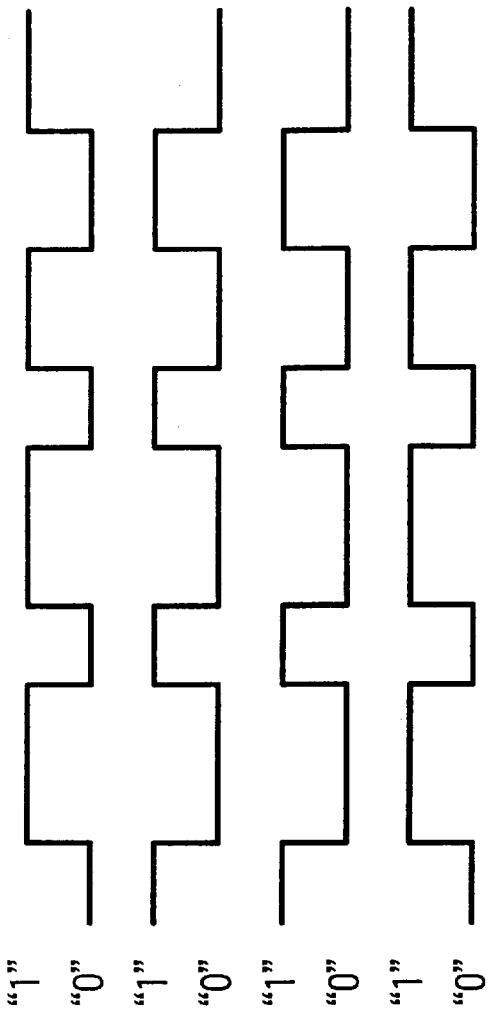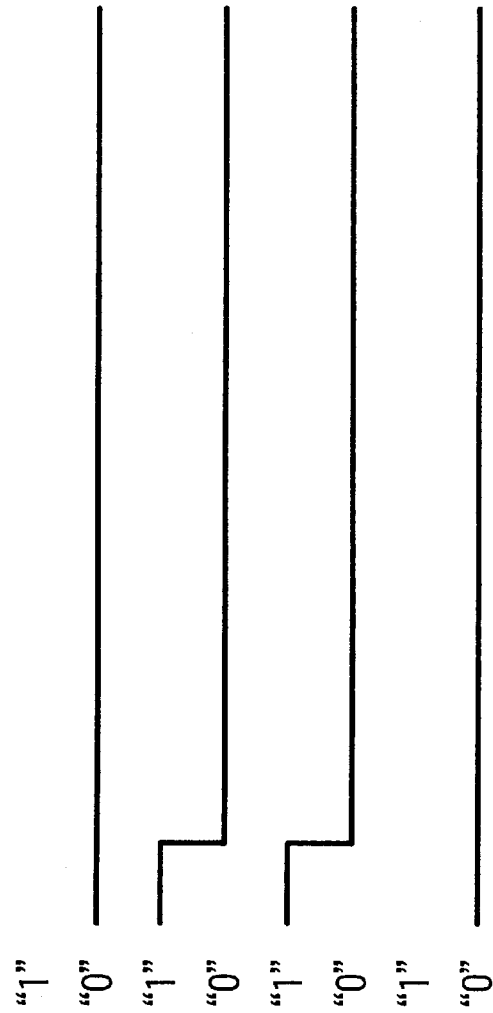

SWITCHING POWER AMPLIFIER

BACKGROUND OF THE INVENTION

1. Field of the Invention

The present invention relates generally to a switching power amplifier and particularly to a switching power amplifier for use in driving a speaker to reproduce sounds.

2. Description of the Related Art

Heretofore, there has been proposed a switching power amplifier for driving a speaker to emanate sounds by a pulse width modulated (PWM) signal which are pulse-width-modulated by audio signals.

FIG. 1 of the accompanying drawings shows an output circuit for such a switching power amplifier according to the related art.

As shown in FIG. 1, the output circuit for such a switching power amplifier includes switching signal input terminals 1a, 1b, 1c and 1d to which there are supplied switching signals of pulse width modulated signals (digital signals) shown in FIGS. 2A to 2D, which are pulse-width-modulated by audio signals, respectively. The above switching signal input terminals 1a, 1b, 1c and 1d are connected to the gates of field-effect transistors 2a, 2b, 2c and 2d comprising switching elements, respectively.

The field-effect transistors 2a, 2b, 2c, 2d are turned on when the pulse width modulated signals (PWM signals) shown in FIGS. 2A to 2D are held at high "1" level and turned off when the pulse width modulated signals are held at low "0" level, respectively, A power source terminal +Vbb, at which a positive DC voltage is supplied, is connected to the drain of the field-effect transistor 2a, the source of the field-effect transistor 2a is connected to the drain of the field-effect transistor 2b, and the source of the field-effect transistor 2b is connected to the ground.

Another power source terminal +Vbb, at which a positive DC voltage is supplied, is connected to the drain of the field-effect transistor 2c, the source of the field-effect transistor 2c is connected to the drain of the field-effect transistor 2d, and the source of the field-effect transistor 2d is connected to the ground.

A junction between the source of the field-effect transistor 2a and the drain of the field-effect transistor 2b is connected to one end of a speaker 6 through a series circuit of a low-pass filter 3 for converting a PWM signal to provide an analog signal, a resistor 4 for detecting a current and a protecting connection switch 5.

A junction between the source of the field-effect transistor 2c and the drain of the field-effect transistor 2d is connected to the other end of the speaker 6 through a series circuit of a low-pass filter 7 for converting a PWM signal to provide an analog signal, a resistor 8 for detecting a current and a protecting connection switch 9.

A voltage developed across the current detection resistor 4 is supplied to an operational amplifying circuit 10 so that, when a current flowing through the current detection resistor 4 is abnormally large in magnitude, the protecting, e.g. relay connection switch 5 is turned off and that the voltage developed across the current detection resistor 8 is supplied to an operational amplifying circuit 11. When a current flowing through this current detection resistor 8 is abnormally large in magnitude, the protecting, e.g. relay connection switch 9 is turned off.

To a control signal input terminal 12 is supplied a control signal having a predetermined time period when the switching power amplifier is energized or de-energized. When the switching power amplifier is energized or de-energized, the connection switches 5 and 9 are turned off during a predetermined time period so that the speaker 6 can be prevented from generating noise when the switching power amplifier is energized or de-energized.

In the output circuit for the switching power amplifier shown in FIG. 1, when the field-effect transistors 2a and 2d are turned on and the field-effect transistors 2b and 2c are turned off, a current flows from the positive power source terminal +Vbb through the field-effect transistor 2a, the low-pass filter 3, the resistor 4, the connection switch 5, the speaker 6, the connection switch 9, the resistor 8, the low-pass filter 7, the field-effect transistor 2d and the ground, in that order. When the field-effect transistors 2b and 2c are turned on and the field-effect transistors 2a and 2d are turned off, a current flows from the positive power source terminal +Vbb through the field-effect transistor 2c, the low-pass filter 7, the resistor 8, the connection switch 9, the speaker 6, the connection switch 5, the resistor 4, the low-pass filter 3, the field-effect transistor 2b and the ground, in that order, to drive the speaker 6 and emanate sounds from the speaker 6.

In the example of the related-art output circuit for the switching power amplifier shown in FIG. 1, the connection switches 5 and 9 are used to protect the switching power amplifier from the excess current and prevent the speaker 6 from generating noise when the power switching amplifier is energized or de-energized, so that, when the relays, for example, are used as the connection switches 5 and 9, the contacts are interposed in the signal path with the result that quality of sound from the speaker 6 is deteriorated and that operation sounds are generated. Although connection switches having very small contact resistance are selected as the connection switches 5 and 9 in order to drive a low impedance load such as a speaker, such connection switches having very small contact resistance are large in size so that the whole of the power switching amplifier cannot be made compact in size as it is desired. Furthermore, when the connection switches 5 and 9 are formed of relays, it is inevitable that an operation speed of the switching power amplifier is lowered.

SUMMARY OF THE INVENTION

In view of the aforesaid aspect, it is an object of the present invention to provide a switching power amplifier in which switching elements can be protected from excess current without using connection switches and in which noise can be prevented from being generated when the power switching amplifier is energized or de-energized.

According to an aspect of the present invention, there is provided a switching power amplifier including first and second switching elements connected in series, in which a load is connected to a junction between the first and second switching elements and in which the first and second switching elements are complementarily turned on and off to thereby drive the load. This switching power amplifier is comprised of control means for controlling the first and second switching elements such that the first and second switching elements are all turned off.

According to the present invention, since the first and second switching elements are all turned off, the output terminal is held at high impedance at that time, which becomes equivalent to the case in which the load is disconnected from the output side. Therefore, the switching power amplifier can be protected from the excess current without using the connection switch.

In accordance with another aspect of the present invention, there is provided a switching power amplifier including first and second switching elements connected in series, third and fourth switching elements connected in series, in which a load is connected between a junction of the first and second switching elements and a junction of the third and fourth switching elements and in which the first, second, third and fourth switching elements are turned on and off to thereby drive the load. This switching power amplifier is comprised of control means for controlling the first, second, third and fourth switching elements such that they are all turned off.

According to the present invention, since the first, second, third and fourth switching elements are all turned off, the output terminal is held at high impedance at that time, which becomes equivalent to the case in which the load is disconnected from the output side. Therefore, the switching power amplifier can be prevented from generating noise without using the connection switch when the switching power amplifier is energized or de-energized

BRIEF DESCRIPTION OF THE DRAWINGS

FIGS. 2A to 2D are waveform diagrams to which reference will be made in explaining the present invention, respectively;

FIGS. 4A to 4D are waveform diagrams to which reference will be made in explaining the present inventions respectively.

DESCRIPTION OF THE PREFERRED EMBODIMENT

Figure 1:
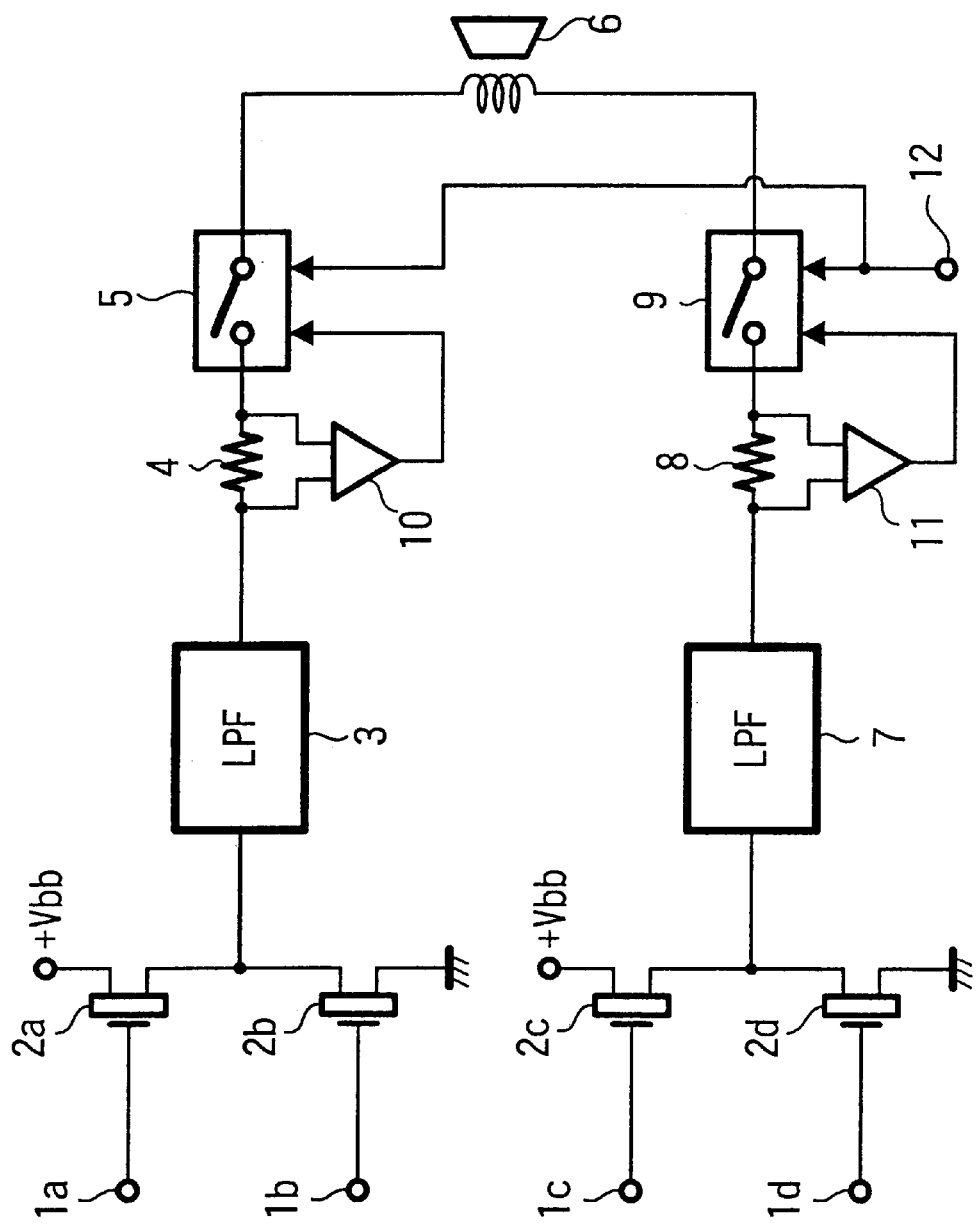
FIG. 1 is a schematic diagram showing an example of an output circuit for a switching power amplifier according to the related art.
Figure 3:
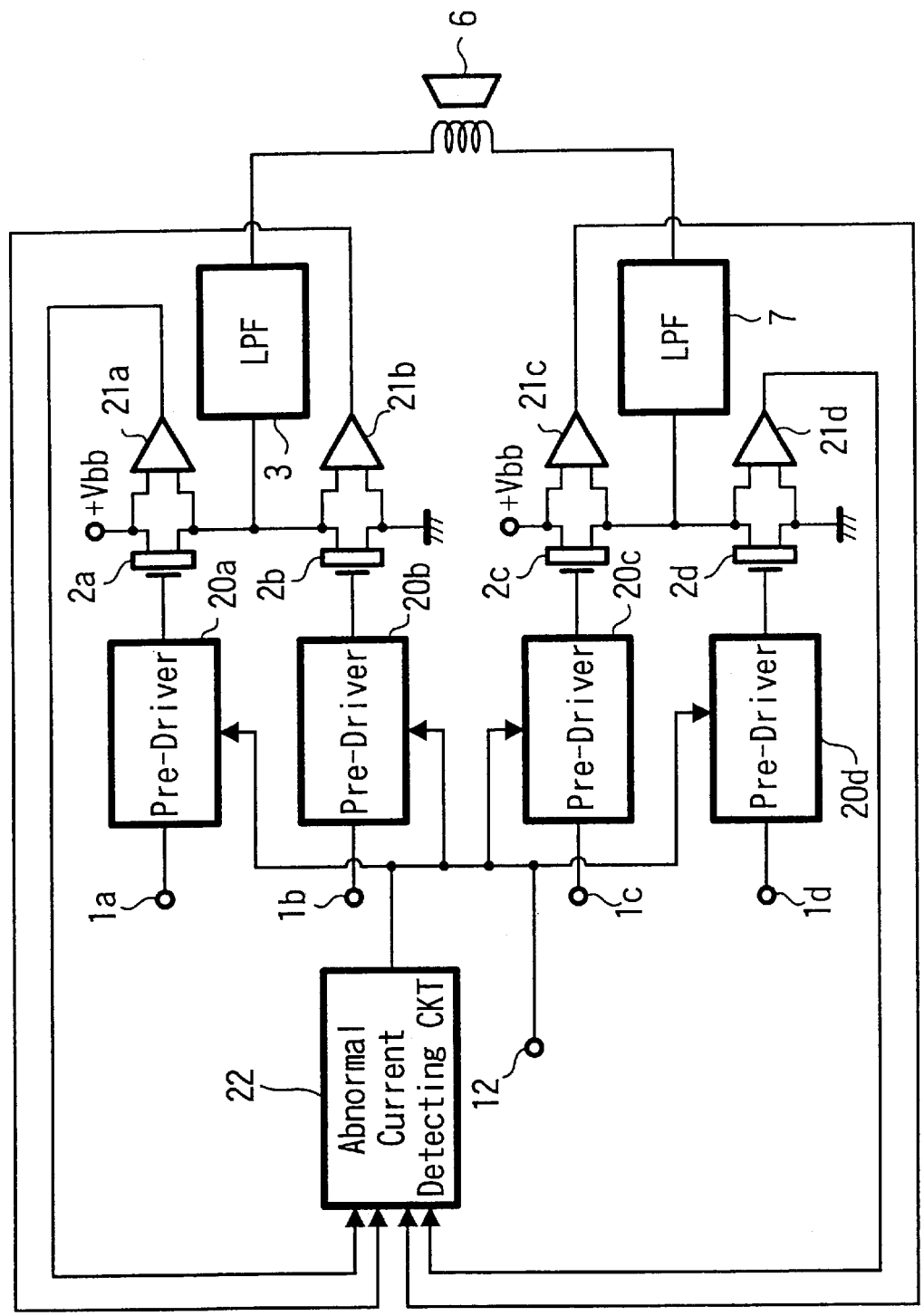
FIG. 3 is a schematic diagram showing an output circuit for a switching power amplifier according to an embodiment of the present invention.

A switching power amplifier according to an embodiment of the present invention will be described below with reference to FIGS. 2A through 2D, FIG. 3 and FIGS. 4A through 4D. In FIG. 3, elements and parts identical to those of FIG. 1 are identified by identical reference numerals.

According to this embodiment shown in FIG. 3, the switching signal input terminals 1a, 1b, 1c and 1d to which the switching signals of the pulse width modulated signals (digital signals) which are pulse-width-modulated by the audio signals as shown in FIGS. 2A, 2B, 2C and 2D are supplied are connected through pre-drivers 20a, 20b, 20c and 20d to the gates of the field-effect transistors 2a, 2b, 2c and 2d comprising the switching elements, respectively.

The field-effect transistors 2a, 2b, 2c, 2d comprising the switching elements are turned on when the pulse width modulated signals (PWM signals) shown in FIGS. 2A to 2D are held at high "1" level and turned off when these pulse width modulated signals are held at low "0" level, respectively.

The pre-drivers 20a, 20b, 20c and 20d amplify the switching signals of the PWM signals, shown in FIGS. 2A to 2D, supplied to the switching signal input terminals 1a, 1b, 1c, 1d and supply amplified switching signals to the field-effect transistors 2a, 2b, 2c, 2d. Simultaneously, when control signals are supplied to control terminals of the pre-drivers 20a, 20b, 20c and 20d, the pre-drivers 20a, 20b, 20c and 20d generate at their output sides switching signals of low "0" level which turn the field-effect transistors 2a, 2b, 2c and 2d off as shown in FIGS. 4A, 4B, 4C and 4D, respectively.

The power source terminal +Vbb, at which a positive DC voltage is supplied, is connected to the drain of the field-effect transistor 2a, the source of the field-effect transistor 2a is connected to the drain of the field-effect transistor 2b, and the source of the field-effect transistor 2b is connected to the ground.

The other power source terminal +Vbb, at which a positive DC voltage is supplied, is connected to the drain of the field-effect transistor 2c, the source of the field-effect transistor 2c is connected to the drain of the field-effect transistor 2d, and the source of the field-effect transistor 2d is connected to the ground.

While only the positive DC voltages are supplied to the power source terminals as described above, the present invention is not limited thereto and positive and negative DC voltages may be supplied to the power supply terminals, respectively.

The junction between the source of the field-effect transistor 2a and the drain of the field-effect transistor 2b is connected to one end of the speaker 6 through the low-pass filter 3 for converting the PWM signal (digital signal) to provide the analog signal. At the same time, the junction between the source of the field-effect transistor 2c and the drain of the field-effect transistor 2d is connected to the other end of the speaker 6 through the low-pass filter 7 for converting the PWM signal to provide the analog signal.

Voltages between the drains and the sources of the field-effect transistors 2a, 2b, 2c and 2d comprising the switching elements are respectively supplied to operational amplifying circuits 21a, 21b, 21c and 21d. Output signals from the operational amplifying circuits 21a, 21b, 21c and 21d are respectively supplied to an abnormal current detecting circuit 22 as current detection signals.

The abnormal current detecting circuit 22 determines based upon the output signals from the operational amplifying circuits 21a, 21b, 21c, 21d whether or not currents flowing through the field-effect transistors 2a, 2b, 2c, 2d comprising the switching elements are excess currents. If it is determined by the abnormal current detecting circuit 22 that the above currents are the excess currents (abnormal currents), then the abnormal current detecting circuit 22 generates a control signal at its output side and supplies this control signal to the control terminals of the pre-drivers 20a, 20b, 20c and 20d.

When the control signal is supplied to the respective control terminals of the pre-drivers 20a, 20b, 20c and 20d, the pre-drivers 20a, 20b, 20c and 20d generate at their output sides switching signals of low "0" level shown in FIGS. 4A, 4B, 4C and 4D to thereby turn the field-effect transistors 2a, 2b, 2c and 2d comprising the switching elements off. As a consequence, the output side is held at high impedance and the flow of excess current is blocked so that the speaker 6 can be protected from the excess current.

When an audio device, for example, is energized or de-energized, the control signal input terminal 12 to which the control signal is supplied is connected to the control terminals of the pre-drivers 20a, 20b, 20c and 20d during a predetermined time period, e.g., longer than a time period during which noise may be generated from the speaker 6 when the audio device is energized or de-energized. As a result, the field-effect transistors 2a, 2b, 2c and 2d comprising the switching elements are respectively turned off during a predetermined time period when the audio device is energized or de-energized and the output side is held at high impedance. Thus, when the audio device is energized or de-energized, the speaker 6 can be prevented from generating noise.

While the control signal supplied to the control signal input terminal 12 and the control signal generated at the output side of the abnormal current detecting circuit 22 are simply supplied to the control terminals of the respective pre-drivers, the present invention is not limited thereto and the respective control signals may be selectively supplied with a priority through a suitable means such as a logic circuit.

Since the switching power amplifier according to this embodiment has the above arrangement, the switching signals of the pulse width modulated signals pulse-width-modulated by the audio signal as shown in FIGS. 2A, 2B, 2C, 2D are supplied to the field-effect transistors 2a, 2b, 2c and 2d so that, when the field-effect transistors 2a and 2d are turned on and the field-effect transistors 2b and 2c are turned off, a current flows from the power source terminal +Vbb through the field-effect transistor 2a, the low-pass filter 3, the speaker 6, the low-pass filter 7, the field-effect transistor 2d and the ground, in that order. Simultaneously, when the field-effect transistors 2b and 2c are turned on and the field-effect transistors 2a and 2d are turned off, a current flows from the power source terminal +Vbb through the field-effect transistor 2c, the low-pass filter 7, the speaker 6, the low-pass filter 3, the field-effect transistor 2b and the ground, in that order. As a consequence, the speaker 6 is driven and sounds emanate from the speaker 6.

According to this embodiment, since the field-effect transistors 2a, 2b, 2c and 2d comprising the switching elements are all turned off when abnormal currents (excess currents) are detected by the operational amplifying circuits 21a, 21b, 21c, 21d and the abnormal current detecting circuit 22, the side of the speaker 6 is held at high impedance at that time, which becomes equivalent to the state in which the speaker 6 of this output side is disconnected. Hence, the speaker 6 can be protected from the excess current.

Since the field-effect transistors 2a, 2b, 2c and 2d comprising the switching elements are all turned off respectively for a predetermined period of time when the switching power amplifier is energized or de-energized, the side of the speaker 6 is held at high impedance at that time, which becomes equivalent to the state in which the speaker 6 of this output side is disconnected. Hence, the speaker can be prevented from generating noise.

While the switching elements 2a, 2b, 2c and 2d are connected in a bridged-T network fashion to provide a so-called BTL (Bridged-Tied Load) configuration in the above-described embodiment, the present invention is not limited thereto and can also be applied to a single-ended configuration. For example, when the switching power amplifier is comprised only of the upper portion of FIG. 3 (the output circuit for the switching power amplifier comprised of the switching elements 2a, 2b), it is sufficient to supply a control signal which can turn both of the switching elements 2a, 2b off. In this case, a capacitor for breaking a DC current may be connected in series between one end of the speaker 6 and the output of the low-pass filter 3, and the other end of the speaker 6 may be grounded.

Furthermore, the control signal may be generated by monitoring intensity of heat generated from the switching elements or by detecting whether or not the load of the switching power amplifier is not placed in the normal state, such as when the load of the switching power amplifier is made open or short-circuited.

Having described a preferred embodiment of the invention with reference to the accompanying drawings, it is to be understood that the invention is not limited to that precise embodiment and that various changes and modifications could be effected therein by one skilled in the art without departing from the spirit or scope of the invention as defined in the appended claims.

What is claimed is:

1. A switching power amplifier including first and second switching elements connected in series, in which a load is connected to a junction between said first and said second switching elements and in which said first and said second switching elements are turned on and turned off to drive said load, said amplifier comprising:

first current detecting means for detecting a current of said first switching element by detecting a voltage between both ends of said first switching element;

second current detecting means for detecting a current of said second switching element by detecting a voltage between both ends of said second switching element;

control means for controlling said first and said second switching elements such that said first and said second switching elements are both turned off in response to receiving a detection signal indicating that at least one of said first current detecting means and said second current detecting means has detected a current having a magnitude larger than a predetermined value.

2. The switching power amplifier according to claim 1, wherein said control means outputs a control signal for turning off both said first and said second switching elements for a predetermined time period when said switching power amplifier is one of energized and de-energized.

3. A switching power amplifier including first and second switching elements connected in series, in which a load is connected to a junction between said first and said second switching elements and in which said first and said second switching elements are turned on and turned off to drive said load, said amplifier comprising:

control means for outputting a control signal for turning off both said first and said second switching elements during a predetermined time period when said switching power amplifier is one of energized and de-energized.

4. A switching power amplifier including first and second switching elements connected in series and third and fourth switching elements connected in series in which a load is connected between a junction of said first and said second switching elements and a junction of said third and said fourth switching elements and in which said first, said second, said third, and said fourth switching elements are turned on and turned off to drive said load, said amplifier comprising:

first current detecting means for detecting a current of said first switching element by detecting a voltage between both ends of said first switching element;

second current detecting means for detecting a current of said second switching element by detecting a voltage between both ends of said second switching element;

third current detecting means for detecting a current of said third switching element by detecting a voltage between both ends of said third switching element;

fourth current detecting means for detecting a current of said fourth switching element by detecting a voltage between both ends of said fourth switching element;

control means for controlling said first, said second, said third, and said fourth switching elements such that said first, said second, said third, and said fourth switching elements are all turned off in response to receiving a detection signal indicating that at least one of said first current detecting means, said second current detecting means, said third current detecting means, and said fourth current detecting means has detected a current having a magnitude larger than a predetermined value.

5. The switching power amplifier according to claim 4, wherein said control means outputs a control signal for turning off all of said first, said second, said third, and said fourth switching elements for a predetermined time period when said switching power amplifier is one of energized and de-energized.

6. A switching power amplifier including first and second switching elements connected in series and third and fourth switching elements connected in series, in which a load is connected between a junction of said first and said second switching elements and a junction of said third and said fourth switching elements and in which said first switching element, said second switching element, said third switching element, and said fourth switching element are turned on and turned off to drive said load, said amplifier comprising:

control means for outputting a control signal for turning off all of said switching elements for a predetermined time period when said switching power amplifier is one of energized and de-energized.

* * * * *